US011307767B1

(12) United States Patent
Sinha et al.

(10) Patent No.: US 11,307,767 B1
(45) Date of Patent: Apr. 19, 2022

(54) SYSTEM FOR CONTROLLING MEMORY OPERATIONS IN SYSTEM-ON-CHIPS

(71) Applicant: NXP USA, Inc., Austin, TX (US)

(72) Inventors: Nidhi Sinha, Noida (IN); Dinesh Joshi, Delhi (IN); Akshay Kumar Pathak, Noida (IN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/071,892

(22) Filed: Oct. 15, 2020

(51) Int. Cl.
*G06F 3/00* (2006.01)
*G06F 3/06* (2006.01)
*G11C 7/10* (2006.01)

(52) U.S. Cl.
CPC .......... *G06F 3/0604* (2013.01); *G06F 3/0659* (2013.01); *G06F 3/0673* (2013.01); *G11C 7/1006* (2013.01)

(58) Field of Classification Search
CPC . G06F 1/1632; G06F 1/26; G06F 1/10; G06F 1/32; G06F 1/3203; G06F 13/24; G06F 13/364; G06F 1/263; G06F 1/3215; G06F 1/325; G06F 11/1608; G06F 11/1641; G06F 11/1658; G06F 11/1679; G06F 13/28; G06F 15/177; G06F 1/04; G06F 1/08; G06F 1/1616; G06F 1/3253; G06F 1/3287; G06F 13/404; G06F 13/4072; G06F 13/4282; G06F 7/57; G06F 7/58; G06F 7/588; G06F 9/30083; G06F 1/12; G06F 1/3228; G06F 1/3237; G06F 1/324; G06F 1/3265; G06F 11/3423; G06F 13/124; G06F 13/4068; G06F 13/4291; G06F 15/78; G06F 2213/0038; G06F 9/30079; G06F 9/3865
USPC .............. 365/163, 148, 226, 230.06, 189.08, 365/189.05, 200, 185.01, 201, 113, 365/185.08, 189.11, 189.15, 222, 230.03, 365/230.08, 233.1, 149, 185.02, 185.22, 365/185.28, 189.03, 168, 185.09, 185.14, 365/185.17, 185.21, 185.23, 185.24
See application file for complete search history.

(56) References Cited

U.S. PATENT DOCUMENTS

| 9,494,969 | B2 | 11/2016 | Gupta et al. | |
|---|---|---|---|---|
| 2012/0124407 | A1 | 5/2012 | Shimizu | |
| 2013/0227257 | A1 | 8/2013 | Singh et al. | |
| 2014/0133252 | A1* | 5/2014 | Ikeda | G11C 7/103 365/193 |

* cited by examiner

*Primary Examiner* — Thong Q Le

(57) ABSTRACT

A system-on-chip (SoC) includes a system memory, a memory controller, and a memory management system coupled therebetween. The memory management system is configured to receive, from the memory controller, a first control signal that is indicative of a memory operation associated with the system memory, and output and provide a second control signal to the system memory to control an execution of the memory operation. The second control signal is outputted such that when the memory operation corresponds to a first read operation, the first read operation is executed with the system memory, and when the memory operation corresponds to a first write operation, a second read operation is executed with the system memory followed by the first write operation. Thus, the memory management system prevents memory corruption of the system memory when an asynchronous reset event is detected in the SoC.

20 Claims, 6 Drawing Sheets

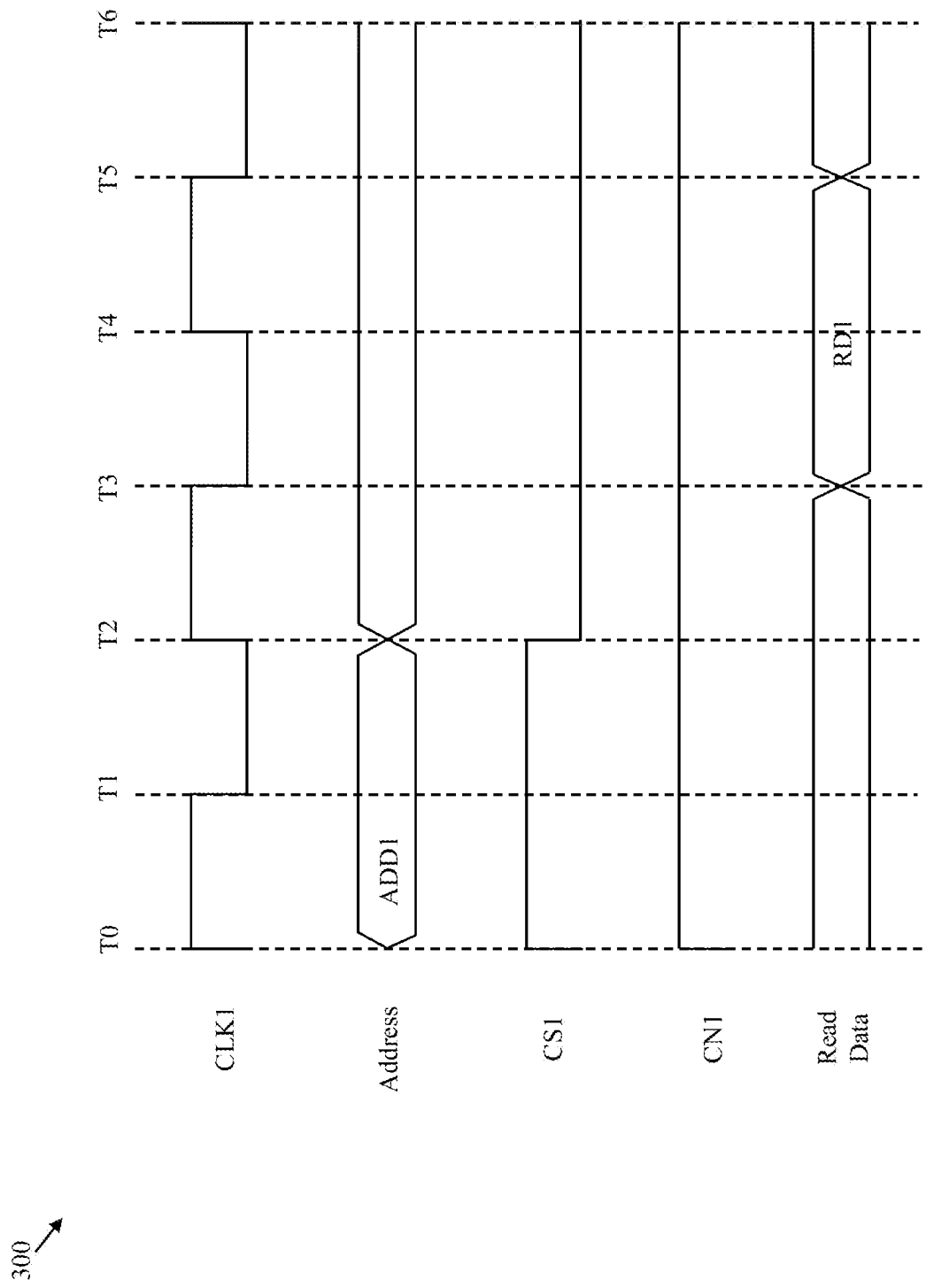

US 11,307,767 B1

SYSTEM FOR CONTROLLING MEMORY OPERATIONS IN SYSTEM-ON-CHIPS

BACKGROUND

The present disclosure relates generally to electronic circuits, and, more particularly, to a system for controlling memory operations in system-on-chips.

In a system-on-chip (SoC), a system memory is utilized extensively to store code, stack, and data associated with various processors of the SoC. The SoC typically includes a memory controller for controlling memory operations (i.e., read and write operations) associated with the system memory. When the SoC is operational, multiple asynchronous reset events (e.g., watchdog reset events) may be detected in the SoC, and corresponding asynchronous reset signals may be received by the memory controller. Each asynchronous reset event results in an asynchronous reset of the memory controller, and in turn, in memory corruption of the system memory. When the system memory is corrupted, the system memory is required to be reinitialized. A time taken to reinitialize the system memory for each asynchronous reset of the memory controller is significant. Hence, it is desirable to retain the system memory (i.e., avoid corruption of the system memory) during each asynchronous reset of the memory controller, and in turn, avoid the reinitialization of the system memory during each asynchronous reset of the memory controller.

A conventional solution to solve the afore-mentioned problem includes holding (i.e., delaying) an asynchronous reset signal that is to be received by the memory controller and other functional components of the SoC until the system memory transitions to a default state (i.e., until ongoing transactions with the system memory are completed). However, delaying the provision of the asynchronous reset signal to the memory controller and other functional components of the SoC delays a fault reaction to the detected asynchronous reset event. Additionally, while the asynchronous reset signal is delayed, various functional components of the SoC continue to operate in a faulty condition, thereby leading to an unreliable behavior of the SoC and a significant degradation in reliability and accuracy of the SoC. Therefore, there exists a need for a technical solution that solves the aforementioned problems of existing memory retention techniques.

SUMMARY

In one embodiment of the present disclosure, a memory management system coupled between a memory controller and a system memory for controlling a memory operation associated with the system memory is disclosed. The memory management system includes first and second flip-flops (FFs) that are coupled with the memory controller, and a logic gate that is coupled with the first and second FFs and the system memory. The first FF is configured to receive a first control signal that is indicative of the memory operation, a power-on reset signal, and a first clock signal, and output a second control signal. Similarly, the second FF is configured to receive the first control signal, the power-on reset signal, and a second clock signal, and output a third control signal. The logic gate is configured to receive the second and third control signals from the first and second FFs, respectively, and output and provide a fourth control signal to the system memory to control an execution of the memory operation. The fourth control signal is outputted such that when the memory operation corresponds to a first read operation, the first read operation is executed with the system memory, and when the memory operation corresponds to a first write operation, a second read operation is executed with the system memory followed by the first write operation.

In another embodiment of the present disclosure, a system-on-chip (SoC) is disclosed. The SoC includes a system memory, a memory controller, and a memory management system that is coupled between the memory controller and the system memory, and configured to control a memory operation associated with the system memory. The memory management system includes first and second flip-flops (FFs) that are coupled with the memory controller, and a logic gate that is coupled with the first and second FFs and the system memory. The first FF is configured to receive a first control signal that is indicative of the memory operation, a power-on reset signal, and a first clock signal, and output a second control signal. Similarly, the second FF is configured to receive the first control signal, the power-on reset signal, and a second clock signal, and output a third control signal. The logic gate is configured to receive the second and third control signals from the first and second FFs, respectively, and output and provide a fourth control signal to the system memory to control an execution of the memory operation. The fourth control signal is outputted such that when the memory operation corresponds to a first read operation, the first read operation is executed with the system memory, and when the memory operation corresponds to a first write operation, a second read operation is executed with the system memory followed by the first write operation.

In some embodiments, the first and second clock signals are complementary signals.

In some embodiments, the memory management system further includes a first set of FFs and a third FF that are coupled between the memory controller and the system memory. The first set of FFs is configured to receive a first address associated with the memory operation, the power-on reset signal, and the second clock signal, and output and provide a second address associated with the memory operation to the system memory to facilitate the execution of the memory operation. Further, the third FF is configured to receive a first chip select signal associated with the memory operation, the power-on reset signal, and the second clock signal, and output and provide a second chip select signal associated with the memory operation to the system memory to control the execution of the memory operation.

In some embodiments, the memory controller is configured to generate and provide, to facilitate the execution of the memory operation, the first control signal to the first and second FFs, the first address to the first set of FFs, and the first chip select signal to the third FF.

In some embodiments, the memory management system further includes a second set of FFs that is coupled between the memory controller and the system memory. When the memory operation corresponds to the first write operation, the second set of FFs is configured to receive first write data associated with the memory operation, the power-on reset signal, and the second clock signal, and output and provide second write data associated with the memory operation to the system memory to facilitate the execution of the memory operation.

In some embodiments, the memory management system further includes a third set of FFs that is coupled between the memory controller and the system memory. Based on the execution of the memory operation, the third set of FFs is configured to receive first read data associated with the memory operation, the power-on reset signal, and the second clock signal, and output and provide second read data associated with the memory operation to the memory controller.

In some embodiments, the first control signal is activated and deactivated when the memory operation corresponds to the first read and first write operations, respectively. When the fourth control signal is activated, at least one of the first and second read operations are executed with the system memory, and when the fourth control signal is deactivated, the first write operation is executed with the system memory.

In some embodiments, when the first control signal is activated for a first cycle of the first clock signal, the fourth control signal is activated for a subsequent cycle of the second clock signal. Further, when the first control signal is deactivated for the first cycle of the first clock signal, the fourth control signal is activated for a first half of the subsequent cycle of the second clock signal, and deactivated for a second half of the subsequent cycle of the second clock signal.

In some embodiments, the SoC further includes first and second reset controllers. The first reset controller is coupled with the memory controller, and configured to generate and provide an asynchronous reset signal to the memory controller to reset the memory controller. Further, the second reset controller is coupled with the memory management system, and configured to generate and provide the power-on reset signal to the memory management system to reset the memory management system.

In some embodiments, the SoC further includes first and second clock circuits and an inverter. The first clock circuit is coupled with the memory controller and the memory management system, and configured to generate and provide the first clock signal to the memory controller and the memory management system. The inverter is coupled with the first clock circuit and the memory management system, and configured to receive the first clock signal, and generate and provide the second clock signal to the memory management system. Further, the second clock circuit is coupled with the system memory, and configured to generate and provide a third clock signal to the system memory. A frequency of each of the first and second clock signals is half of a frequency of the third clock signal.

In some embodiments, when the memory operation corresponds to the first write operation, the execution of the second read operation with the system memory followed by the first write operation prevents memory corruption of the system memory.

Various embodiments of the present disclosure disclose a system-on-chip (SoC) that includes a system memory, a memory controller, and a memory management system coupled between the memory controller and the system memory. The memory management system is configured to control a memory operation associated with the system memory. The memory management system includes first and second flip-flops (FFs) that are coupled with the memory controller, and configured to receive a first control signal that is indicative of the memory operation. The first and second FFs are further configured to receive first and second control signals, respectively, and a power-on reset signal. Further, the first and second FFs are configured to output second and third control signals, respectively. The memory management system further includes a logic gate that is coupled with the first and second FFs, and configured to receive the second and third control signals, respectively, Further, the logic gate is coupled with the system memory, and configured to output and provide a fourth control signal to the system memory to control an execution of the memory operation. The fourth control signal is outputted such that when the memory operation corresponds to a first read operation, the first read operation is executed with the system memory, and when the memory operation corresponds to a first write operation, a second read operation is executed with the system memory followed by the first write operation.

Thus, the utilization of the memory management system of the present disclosure in the SoC to control memory operations associated with the system memory ensures that a reset of the memory controller during either of read or write operation does not lead to memory corruption of the system memory. As a result, when an asynchronous reset event is detected in the SoC, a need to delay the provision of a corresponding asynchronous reset signal to the memory controller and other functional components of the SoC is eliminated. In other words, when the asynchronous reset event is detected in the SoC, the corresponding asynchronous reset signal is provided to the memory controller and other functional components of the SoC instantaneously. Hence, a reaction time associated with the detected asynchronous reset event in the SoC of the present disclosure is significantly less than that in an SoC implementing a conventional memory retention technique. The conventional memory retention technique includes delaying the reset of a memory controller and other functional components of the SoC until a corresponding system memory has transitioned to a default state. Further, as the reset of the memory controller and other functional components of the SoC is not delayed, none of the functional components operate in a faulty condition. Thus, reliability and accuracy of the SoC of the present disclosure are significantly greater than that of an SoC implementing the conventional memory retention technique.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

FIGS. 3A and 3B, collectively, represent a timing diagram that illustrates execution of a first read operation with a system memory of the SoC of FIG. 1 in accordance with an embodiment of the present disclosure.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
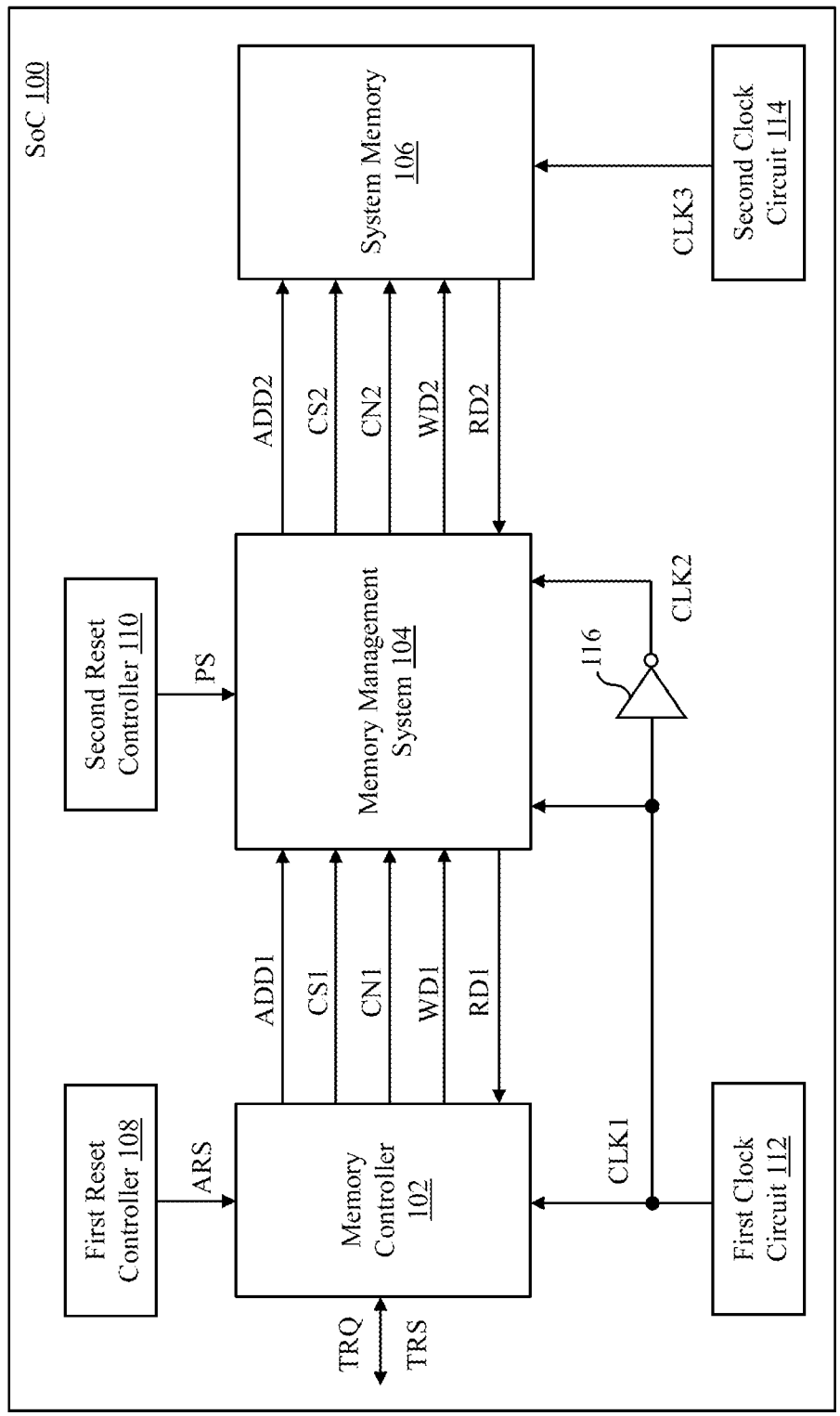
FIG. 1 illustrates a schematic block diagram of a system-on-chip (SoC) in accordance with an embodiment of the present disclosure.

FIG. 1 illustrates a schematic block diagram of a system-on-chip (SoC) 100 in accordance with an embodiment of the present disclosure. The SoC 100 includes a memory controller 102, a memory management system 104, a system memory 106, first and second reset controllers 108 and 110, first and second clock circuits 112 and 114, and an inverter 116. The SoC 100 may be included in various devices such as automotive devices, network devices, or the like.

The memory controller 102 is coupled with various other functional components (not shown) of the SoC 100 (e.g., processors (not shown)). The memory controller 102 may include suitable logic, circuitry, interfaces, and/or code, executable by the circuitry, that may be configured to perform one or more operations. For example, the memory controller 102 is configured to receive various transaction requests that are indicative of various memory operations initiated by the processors with the system memory 106. In one example, the memory controller 102 is configured to receive a transaction request TRQ that is indicative of a memory operation initiated by one of the processors with the system memory 106.

When the memory operation corresponds to a first read operation, the transaction request TRQ includes a virtual memory address (not shown) of the system memory 106 where the memory operation is to be executed. When the memory operation corresponds to a first write operation, the transaction request TRQ includes the virtual memory address and first write data WD1 associated with the memory operation that is to be written to the system memory 106. In response to the transaction request TRQ, the memory controller 102 is further configured to generate and provide a transaction response TRS to the processor initiating the memory operation. When the memory operation corresponds to the first read operation, the transaction response TRS includes first read data RD1 associated with the memory operation that is read from the system memory 106. When the memory operation corresponds to the first write operation, the transaction response TRS is indicative of a status of the memory operation (i.e., whether the execution of the memory operation is successful or unsuccessful).

The memory controller 102 is further coupled with the first clock circuit 112, and further configured to receive a first clock signal CLK1. The memory controller 102 operates in synchronization with the first clock signal CLK1. In other words, an operating frequency of the memory controller 102 is equal to a frequency of the first clock signal CLK1. Further, the memory controller 102 is coupled with the first reset controller 108, and configured to receive an asynchronous reset signal ARS. The memory controller 102 is reset based on the asynchronous reset signal ARS. In an embodiment, when the asynchronous reset signal ARS is activated (i.e., is at a logic high state), the memory controller 102 is reset. Further, when the asynchronous reset signal ARS is deactivated (i.e., is at a logic low state), the memory controller 102 is operational.

The memory controller 102 is further configured to facilitate the execution of the memory operation. To facilitate the execution of the memory operation, the memory controller 102 is further configured to generate, based on the received transaction request TRQ, a first control signal CN1, a first address ADD1, and a first chip select signal CS1 that are associated with the memory operation.

The first control signal CN1 is indicative of the memory operation to be executed with the system memory 106. In other words, the first control signal CN1 indicates whether the memory operation corresponds to the first read operation or the first write operation. In an embodiment, when the memory operation corresponds to the first read operation, the memory controller 102 activates the first control signal CN1 (i.e., generates the first control signal CN1 at a logic high state). Further, when the memory operation corresponds to the first write operation, the memory controller 102 deactivates the first control signal CN1 (i.e., generates the first control signal CN1 at a logic low state).

The first address ADD1 corresponds to a physical memory address of the system memory 106 where the memory operation is to be executed. To generate the first address ADD1, the memory controller 102 is further configured to extract the virtual memory address from the transaction request TRQ, and convert the virtual memory address into the physical memory address. The first address ADD1 includes a first set of address bits (not shown).

The execution of the memory operation with the system memory 106 is controlled by way of the first chip select signal CS1. In an embodiment, when the memory operation is to be executed with the system memory 106, the memory controller 102 activates the first chip select signal CS1 (i.e., generates the first chip select signal CS1 at a logic high state). Further, during an absence of a memory operation to be executed with the system memory 106, the memory controller 102 deactivates the first chip select signal CS1 (i.e., generates the first chip select signal CS1 at a logic low state).

The memory controller 102 is further coupled with the memory management system 104, and further configured to provide the first control signal CN1, the first address ADD1, and the first chip select signal CS1 to the memory management system 104. When the memory operation corresponds to the first write operation, the memory controller 102 is further configured to provide the first write data WD1 to the memory management system 104. In an embodiment, the memory controller 102 may be configured to extract the first write data WD1 from the transaction request TRQ, prior to providing the first write data WD1 to the memory management system 104. The first write data WD1 includes a first set of write data bits (not shown). Further, when the memory operation corresponds to the first read operation, the memory controller 102 is further configured to receive the first read data RD1 from the memory management system 104. The first read data RD1 includes a first set of read data bits (not shown). The memory controller 102 generates the transaction response TRS based on the received first read data RD1.

The memory management system 104 is coupled with the memory controller 102, and configured to receive the first control signal CN1, the first address ADD1, and the first chip select signal CS1. Further, the memory management system 104 is coupled with the first clock circuit 112 and the inverter 116, and configured to receive the first clock signal CLK1 and a second clock signal CLK2 from the first clock circuit 112 and the inverter 116, respectively. The second clock signal CLK2 is an inverted version of the first clock signal CLK1. Hence, a frequency of the second clock signal CLK2 is equal to the frequency of the first clock signal CLK1. Further, the memory management system 104 operates in synchronization with the first and second clock signals CLK1 and CLK2. In other words, an operating frequency of the memory management system 104 is equal to the frequencies of the first and second clock signals CLK1 and CLK2. The memory management system 104 is further coupled with the second reset controller 110, and further configured to receive a power-on reset signal PS. In an embodiment, when the power-on reset signal PS is activated (i.e., is at a logic high state), the memory management system 104 is reset. Further, when the power-on reset signal PS is deactivated (i.e., is at a logic low state), the memory management system 104 is operational. It will be apparent to a person skilled in the art that the activation of the power-on reset signal PS results in a reset of the SoC 100. Thus, when the power-on reset signal PS is activated, the asynchronous reset signal ARS is activated.

The memory management system 104 is further coupled with the system memory 106, and further configured to control the memory operation associated with the system memory 106. To control the memory operation, the memory management system 104 is further configured to output and provide, to the system memory 106, a second control signal CN2, a second address ADD2, and a second chip select signal CS2 that are associated with the memory operation.

The second address ADD2 is outputted based on the first address ADD1, the second clock signal CLK2, and the power-on reset signal PS. The second address ADD2 includes a second set of address bits (not shown). Similarly, the second chip select signal CS2 is outputted based on the first chip select signal CS1, the second clock signal CLK2, and the power-on reset signal PS. When the memory operation is to be executed with the system memory 106 (i.e., when the first chip select signal CS1 is activated), the memory management system 104 activates the second chip select signal CS2 (i.e., generates the second chip select signal CS2 at a logic high state). During an absence of a memory operation to be executed with the system memory 106 (i.e., when the first chip select signal CS1 is deactivated), the memory management system 104 deactivates the second chip select signal CS2 (i.e., generates the second chip select signal CS2 at a logic low state).

The second control signal CN2 is outputted based on the first and second clock signals CLK1 and CLK2, the first control signal CN1, and the power-on reset signal PS. In an embodiment, when the first control signal CN1 is activated for a first cycle of the first clock signal CLK1, the memory management system 104 activates the second control signal CN2 (i.e., generates the second control signal CN2 at a logic high state) for a subsequent cycle of the second clock signal CLK2. Further, when the first control signal CN1 is deactivated for the first cycle of the first clock signal CLK1, the memory management system 104 activates the second control signal CN2 for a first half of the subsequent cycle of the second clock signal CLK2, and deactivates the second control signal CN2 (i.e., generates the second control signal CN2 at a logic low state) for a second half of the subsequent cycle of the second clock signal CLK2. Based on a logic state of the second control signal CN2, read and write operations are executed with the system memory 106.

When the second control signal CN2 is activated, at least one of the first and second read operations are executed with the system memory 106. Further, when the second control signal CN2 is deactivated, the first write operation is executed with the system memory 106. Thus, the second control signal CN2 is outputted such that when the memory operation corresponds to the first read operation, the first read operation is executed with the system memory 106. Similarly, when the memory operation corresponds to the first write operation, a second read operation is executed with the system memory 106 followed by the first write operation. It will be apparent to a person skilled in the art that the execution of the second read operation is similar to that of the first read operation.

When the memory operation corresponds to the first write operation, the memory management system 104 is further configured to receive the first write data WD1 from the memory controller 102, and output and provide second write data WD2 associated with the memory operation to the system memory 106 to write thereto. The second write data WD2 is outputted based on the second clock signal CLK2, the first write data WD1, and the power-on reset signal PS. The second write data WD2 includes a second set of write data bits (not shown). Further, when the memory operation corresponds to the first read operation, the memory management system 104 is further configured to receive second read data RD2 associated with the memory operation from the system memory 106. The second read data RD2 corresponds to data stored in the system memory 106 at the second address ADD2, and includes a second set of read data bits (not shown). Further, the memory management system 104 is configured to output and provide the first read data RD1 to the memory controller 102. The first read data RD1 is outputted based on the second read data RD2, the second clock signal CLK2, and the power-on reset signal PS.

When the memory controller 102 is operational (i.e., when the asynchronous reset signal ARS is deactivated), the memory management system 104 receives the first address ADD1, the first chip select signal CS1, and the first control signal CN1 from the memory controller 102, and outputs and provides the second address ADD2, the second chip select signal CS2, and the second control signal CN2 to the system memory 106, respectively. When the memory operation corresponds to the first write operation, the memory management system 104 further receives the first write data WD1 from the memory controller 102, and outputs and provides the second write data WD2 to the system memory 106. Further, when the memory operation corresponds to the first read operation, the memory management system 104 receives the second read data RD2 from the system memory 106, and outputs and provides the first read data RD1 to the memory controller 102.

When the asynchronous reset signal ARS is activated, the memory controller 102 is reset. The asynchronous reset of the memory controller 102 may result in asynchronous toggling of the first control signal CN1, the first address ADD1 (i.e., the first set of address bits), and the first chip select signal CS1. In such a scenario, the toggled first address ADD1, the toggled first chip select signal CS1, and the toggled first control signal CN1 are provided to the memory management system 104. Further, the memory management system 104 outputs the second address ADD2, the second chip select signal CS2, and the second control signal CN2 based on the toggled the first address ADD1, the toggled first chip select signal CS1, and the toggled first control signal CN1, respectively.

When the memory operation corresponds to the first write operation, the reset of the memory controller 102 may further result in asynchronous toggling of the first write data WD1 (i.e., the first set of write data bits). In such a scenario, the toggled first write data WD1 is provided to the memory management system 104, and the memory management system 104 outputs the second write data WD2 based on the toggled first write data WD1. Further, when the memory operation corresponds to the first read operation, the first read data RD1 is unaffected by the asynchronous reset of the memory controller 102.

The system memory 106 is configured to store data (such as the second read data RD2). The system memory 106 is coupled with the second clock circuit 114, and configured to receive a third clock signal CLK3. The third clock signal CLK3 is generated such that a frequency of the third clock signal CLK3 is twice the frequencies of the first and second clock signals CLK1 and CLK2 (i.e., the frequency of each of the first and second clock signals CLK1 and CLK2 is half of the frequency of the third clock signal CLK3). The system memory 106 operates in synchronization with the third clock signal CLK3. In other words, an operating frequency of the system memory 106 is equal to the frequency of the third clock signal CLK3. The system memory 106 is further coupled with the memory management system 104, and configured to receive the second address ADD2, the second chip select signal CS2, and the second control signal CN2.

When the second control signal CN2 is activated, the system memory 106 is further configured to provide the stored second read data RD2 to the memory management system 104. The second read data RD2 corresponds to data stored at the second address ADD2. When the second control signal CN2 is deactivated, the system memory 106 is further configured to receive the second write data WD2 from the memory management system 104, and store the received second write data WD2 at the second address ADD2.

The first reset controller 108 is coupled with the memory controller 102 and other functional components of the SoC 100. The first reset controller 108 is configured to generate and provide the asynchronous reset signal ARS to the memory controller 102 and other functional components of the SoC 100 to reset the memory controller 102 and other functional components of the SoC 100. The asynchronous reset signal ARS may be generated based on a detection of an asynchronous reset event in the SoC 100. Examples of the asynchronous reset event may include a watchdog reset event, a reset event resulting from a fault in a program code, or the like. The second reset controller 110 is coupled with the memory management system 104, and configured to generate and provide the power-on reset signal PS to the memory management system 104 to reset the memory management system 104.

The first and second clock circuits 112 and 114 are configured to generate the first and third clock signals CLK1 and CLK3, respectively. Further, the first clock circuit 112 is coupled with the memory controller 102 and the memory management system 104, and configured to provide the first clock signal CLK1 to the memory controller 102 and the memory management system 104. Similarly, the second clock circuit 114 is coupled with the system memory 106, and further configured to provide the third clock signal CLK3 to the system memory 106. The memory controller 102 and the memory management system 104 operate in synchronization with the first clock signal CLK1, whereas the system memory 106 operates in synchronization with the third clock signal CLK3.

The inverter 116 is coupled with the first clock circuit 112, and configured to receive the first clock signal CLK1 and generate an inverted version of the first clock signal CLK1, i.e., the second clock signal CLK2. Thus, the frequencies of the first and second clock signals CLK1 and CLK2 are equal. Further, the inverter 116 is coupled with the memory management system 104, and configured to provide the second clock signal CLK2 to the memory management system 104. The memory management system 104 further operates in synchronization with the second clock signal CLK2.

Figure 2:
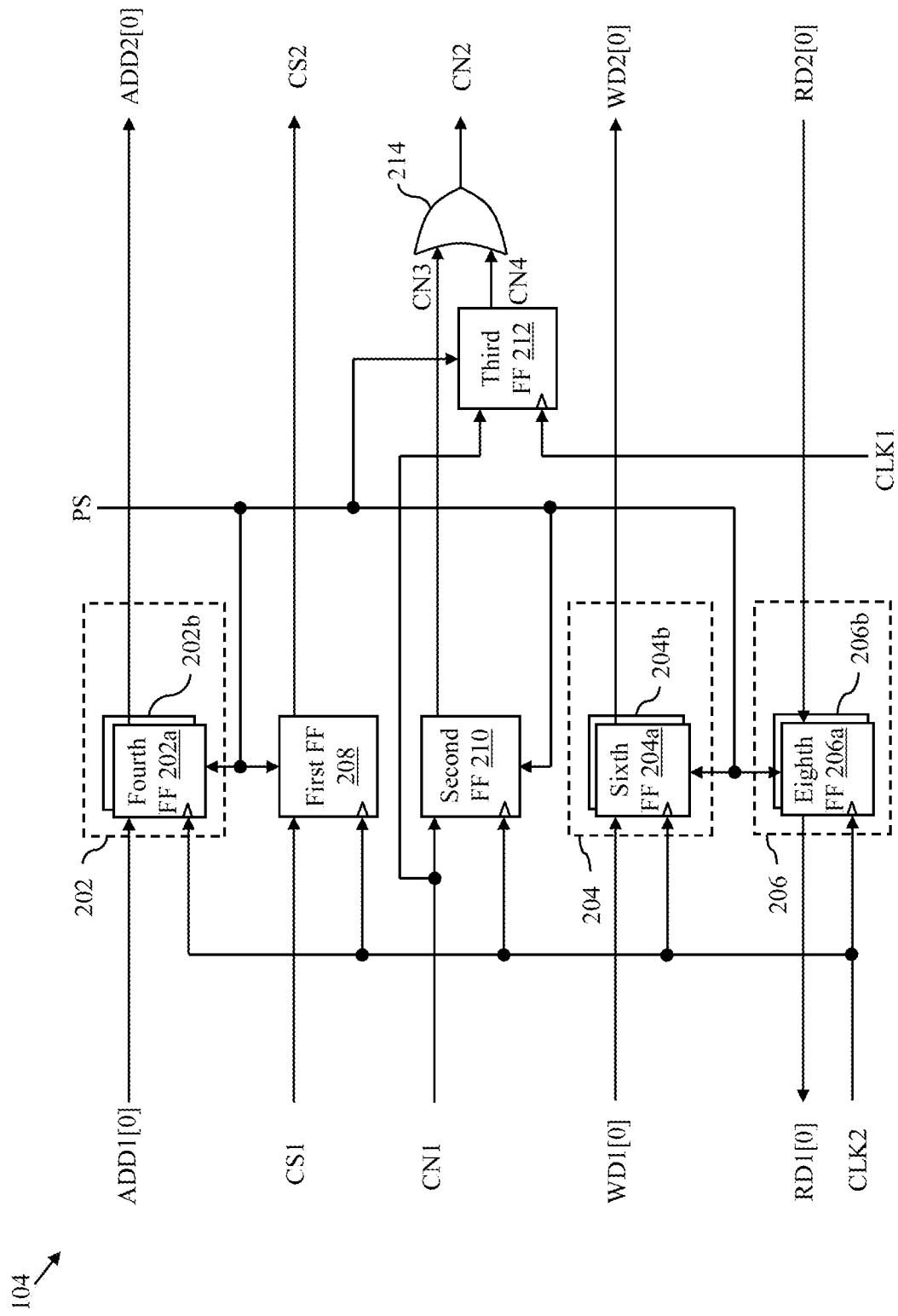
FIG. 2 illustrates a schematic block diagram of a memory management system of the SoC of FIG. 1 in accordance with an embodiment of the present disclosure.

FIG. 2 illustrates a schematic block diagram of the memory management system 104 in accordance with an embodiment of the present disclosure. The memory management system 104 includes first through third sets of flip-flops (FFs) 202-206, first through third FFs 208-212, and a logic gate 214.

The first set of FFs 202 is coupled between the memory controller 102 and the system memory 106, and includes fourth and fifth FFs 202a and 202b. Each FF of the first set of FFs 202 has an input terminal, a clock terminal, a control terminal, and an output terminal. The input terminal of each FF of the first set of FFs 202 is coupled with the memory controller 102, and configured to receive one address bit of the first address ADD1 (i.e., one address bit of the first set of address bits). For example, the input terminal of the fourth FF 202a is coupled with the memory controller 102, and configured to receive a first address bit ADD1[0] of the first address ADD1. The first set of FFs 202 is thus configured to receive the first address ADD1. In other words, the memory controller 102 is further configured to provide the first address ADD1 (i.e., the first set of address bits) to the first set of FFs 202 (i.e., the input terminals of the first set of FFs 202).

It will be apparent to a person skilled in the art that the first set of FFs 202 is shown to include two FFs (such as the fourth and fifth FFs 202a and 202b) to make the illustrations concise and clear, and should not be considered as a limitation of the present disclosure. In various other embodiments, the first set of FFs 202 may include more than two FFs, without deviating from the scope of the present disclosure. For example, if the first address ADD1 corresponds to an 8-bit memory address, the first set of FFs 202 may include eight FFs to receive the first address ADD1.

The clock terminal of each FF of the first set of FFs 202 is coupled with the inverter 116, and configured to receive the second clock signal CLK2. The control terminal of each FF of the first set of FFs 202 is coupled with the second reset controller 110, and configured to receive the power-on reset signal PS. Thus, the first set of FFs 202 is further configured to receive the second clock signal CLK2 and the power-on reset signal PS.

The output terminal of each FF of the first set of FFs 202 is coupled with the system memory 106, and configured to output and provide a corresponding address bit of the second address ADD2 (i.e., a corresponding address bit of the second set of address bits) to the system memory 106 to facilitate the execution of the memory operation. For example, the output terminal of the fourth FF 202a is coupled with the system memory 106, and configured to output and provide a second address bit ADD2[0] of the second address ADD2 to the system memory 106. In an embodiment, the output terminal of each FF of the first set of FFs 202 corresponds to a positive output terminal of each FF of the first set of FFs 202. The first set of FFs 202 is thus further configured to output and provide the second address ADD2 to the system memory 106 to facilitate the execution the memory operation.

When the power-on reset signal PS is deactivated, each FF of the first set of FFs 202 is operational and outputs the associated address bit of the second address ADD2 at a positive edge of the second clock signal CLK2. Further, each FF of the first set of FFs 202 is non-operational (i.e., is reset) when the power-on reset signal PS is activated. It will be apparent to a person skilled in the art that the second set of address bits has the same logic states as that of the first set of address bits, respectively, and is outputted in synchronization with the positive edge of the second clock signal CLK2. In an embodiment, each FF of the first set of FFs 202 is a D FF.

The first FF 208 is coupled between the memory controller 102 and the system memory 106. The first FF 208 has an input terminal, a clock terminal, a control terminal, and an output terminal. The input terminal of the first FF 208 is coupled with the memory controller 102, and configured to receive the first chip select signal CS1. In other words, the memory controller 102 is further configured to provide the first chip select signal CS1 to the first FF 208 (i.e., the input terminal of the first FF 208). The clock terminal of the first FF 208 is coupled with the inverter 116, and configured to receive the second clock signal CLK2, and the control terminal of the first FF 208 is coupled with the second reset controller 110, and configured to receive the power-on reset signal PS. Further, the output terminal of the first FF 208 is coupled with the system memory 106, and configured to output and provide the second chip select signal CS2 to the system memory 106 to control the execution of the memory operation. In an embodiment, the output terminal of the first FF 208 corresponds to a positive output terminal of the first FF 208.

When the power-on reset signal PS is deactivated, the first FF 208 is operational and outputs the second chip select signal CS2 at the positive edge of the second clock signal CLK2. The first FF 208 is non-operational (i.e., is reset) when the power-on reset signal PS is activated. It will be apparent to a person skilled in the art that the second chip select signal CS2 has the same logic state as that of the first chip select signal CS1, and is outputted in synchronization with the positive edge of the second clock signal CLK2. In an embodiment, the first FF 208 is a D FF.

The second and third FFs 210 and 212 have input terminals, clock terminals, control terminals, and output terminals. The input terminals of the second and third FFs 210 and 212 are coupled with the memory controller 102, and configured to receive the first control signal CN1. In other words, the memory controller 102 is further configured to provide the first control signal CN1 to the second and third FFs 210 and 212 (i.e., the input terminals of the second and third FFs 210 and 212). The clock terminals of the second and third FFs 210 and 212 are coupled with the inverter 116 and the first clock circuit 112, and configured to receive the second and first clock signals CLK2 and CLK1, respectively. Similarly, the control terminals of the second and third FFs 210 and 212 are coupled with the second reset controller 110, and configured to receive the power-on reset signal PS. Further, the output terminals of the second and third FFs 210 and 212 are configured to output third and fourth control signals CN3 and CN4, respectively. In an embodiment, the output terminals of the second and third FFs 210 and 212 correspond to positive output terminals of the second and third FFs 210 and 212, respectively.

When the power-on reset signal PS is deactivated, the second and third FFs 210 and 212 are operational and output the third and fourth control signals CN3 and CN4 at the positive edges of the second and first clock signals CLK2 and CLK1, respectively. The second and third FFs 210 and 212 are non-operational (i.e., are reset) when the power-on reset signal PS is activated. It will be apparent to a person skilled in the art that the third and fourth control signals CN3 and CN4 have the same logic state as that of the first control signal CN1, and are outputted in synchronization with the positive edges of the second and first clock signals CLK2 and CLK1, respectively. In an embodiment, the second and third FFs 210 and 212 are D FFs.

The logic gate 214 has first and second input terminals and an output terminal. The first and second input terminals of the logic gate 214 are coupled with the second and third FFs 210 and 212 (i.e., the output terminals of the second and third FFs 210 and 212), and configured to receive the third and fourth control signals CN3 and CN4, respectively. Further, the output terminal of the logic gate 214 is coupled with the system memory 106, and configured to output and provide the second control signal CN2 to the system memory 106 to control the execution of the memory operation. In one embodiment, the second control signal CN2 is activated when one of the third and fourth control signals CN3 and CN4 are activated (i.e., are at logic high states), and deactivated when the third and fourth control signals CN3 and CN4 are deactivated (i.e., are at logic low states). In an embodiment, the logic gate 214 is an OR gate.

When the memory operation corresponds to the first read operation, the first control signal CN1 is activated. When the first control signal CN1 is activated, the third and fourth control signals CN3 and CN4 are activated at the subsequent positive edges of the second and first clock signals CLK2 and CLK1, respectively. Further, the first and second clock signals CLK1 and CLK2 are complementary signals. Thus, when the first control signal CN1 is activated for the first cycle of the first clock signal CLK1, the third control signal CN3 is activated for the subsequent cycle of the second clock signal CLK2. Further, the fourth control signal CN4 is deactivated for the first half of the subsequent cycle of the second clock signal CLK2, and activated for the second half of the subsequent cycle of the second clock signal CLK2. As a result, the second control signal CN2 is activated for the subsequent cycle of the second clock signal CLK2. Thus, the second control signal CN2 is outputted such that when the memory operation corresponds to the first read operation, the first read operation is executed with the system memory 106.

When the memory operation corresponds to the first write operation, the first control signal CN1 is deactivated. When the first control signal CN1 is deactivated, the third and fourth control signals CN3 and CN4 are deactivated at the subsequent positive edges of the second and first clock signals CLK2 and CLK1, respectively. Further, the first and second clock signals CLK1 and CLK2 are complementary signals. Thus, when the first control signal CN1 is deactivated for the first cycle of the first clock signal CLK1, the third control signal CN3 is deactivated for the subsequent cycle of the second clock signal CLK2. Further, the fourth control signal CN4 is activated for the first half of the subsequent cycle of the second clock signal CLK2, and deactivated for the second half of the subsequent cycle of the second clock signal CLK2. As a result, the second control signal CN2 is activated for the first half of the subsequent cycle of the second clock signal CLK2, and deactivated for the second half of the subsequent cycle of the second clock signal CLK2. Thus, the second control signal CN2 is outputted such that when the memory operation corresponds to the first write operation, the second read operation is executed with the system memory 106 followed by the first write operation. Further, when the memory operation corresponds to the first write operation, the execution of the second read operation with the system memory 106 followed by the first write operation prevents memory corruption of the system memory 106.

The second set of FFs 204 is coupled between the memory controller 102 and the system memory 106, and includes sixth and seventh FFs 204a and 204b. Each FF of the second set of FFs 204 has an input terminal, a clock terminal, a control terminal, and an output terminal. The input terminal of each FF of the second set of FFs 204 is coupled with the memory controller 102, and configured to receive one write data bit of the first write data WD1 (i.e., one write data bit of the first set of write data bits). For example, the input terminal of the sixth FF 204a is coupled with the memory controller 102, and configured to receive a first write data bit WD1[0] of the first write data WD1. The second set of FFs 204 is thus configured to receive the first write data WD1 from the memory controller 102. Further, the second set of FFs 204 receives the first write data WD1 from the memory controller 102 when the memory operation corresponds to the first write operation.

It will be apparent to a person skilled in the art that the second set of FFs 204 is shown to include two FFs (such as the sixth and seventh FFs 204a and 204b) to make the illustrations concise and clear, and should not be considered as a limitation of the present disclosure. In various other embodiments, the second set of FFs 204 may include more than two FFs, without deviating from the scope of the present disclosure. For example, if the first write data WD1 corresponds to an 8-bit data, the second set of FFs 204 may include eight FFs to receive the first write data WD1.

The clock terminal of each FF of the second set of FFs 204 is coupled with the inverter 116, and configured to receive the second clock signal CLK2, and the control terminal of each FF of the second set of FFs 204 is coupled with the second reset controller 110, and configured to receive the power-on reset signal PS. Thus, the second set of FFs 204 is further configured to receive the second clock signal CLK2 and the power-on reset signal PS.

The output terminal of each FF of the second set of FFs 204 is coupled with the system memory 106, and configured to output and provide a corresponding write data bit of the second write data WD2 (i.e., a corresponding write data bit of the second set of write data bits) to the system memory 106 to facilitate the execution of the memory operation. For example, the output terminal of the sixth FF 204a is coupled with the system memory 106, and configured to output and provide a second write data bit WD2[0] of the second write data WD2 to the system memory 106. The second set of FFs 204 is thus further configured to output and provide the second write data WD2 to the system memory 106. In an embodiment, the output terminal of each FF of the second set of FFs 204 corresponds to a positive output terminal of each FF of the second set of FFs 204.

When the power-on reset signal PS is deactivated, each FF of the second set of FFs 204 is operational and outputs the associated write data bit of the second write data WD2 at the positive edge of the second clock signal CLK2. Further, each FF of the second set of FFs 204 is non-operational (i.e., is reset) when the power-on reset signal PS is activated. It will be apparent to a person skilled in the art that the second set of write data bits has the same logic states as that of the first set of write data bits, respectively, and is outputted in synchronization with the positive edge of the second clock signal CLK2. In an embodiment, each FF of the second set of FFs 204 is a D FF.

The third set of FFs 206 is coupled between the memory controller 102 and the system memory 106. The third set of FFs 206 includes eighth and ninth FFs 206a and 206b. Each FF of the third set of FFs 206 has an input terminal, a clock terminal, a control terminal, and an output terminal. The input terminal of each FF of the third set of FFs 206 is coupled with the system memory 106, and configured to receive one read data bit of the second read data RD2 (i.e., one read data bit of the second set of read data bits). For example, the input terminal of the eighth FF 206a is coupled with the system memory 106, and configured to receive a first read data bit RD2[0] of the second read data RD2. The third set of FFs 206 is thus configured to receive the second read data RD2 from the system memory 106. The third set of FFs 206 receives the second read data RD2 from the system memory 106 when the memory operation corresponds to the first read operation. Further, the third set of FFs 206 receives the second read data RD2 when the second read operation is executed with the system memory 106.

It will be apparent to a person skilled in the art that the third set of FFs 206 is shown to include two FFs (such as the eighth and ninth FFs 206a and 206b) to make the illustrations concise and clear, and should not be considered as a limitation of the present disclosure. In various other embodiments, the third set of FFs 206 may include more than two FFs, without deviating from the scope of the present disclosure. For example, if the second read data RD2 corresponds to an 8-bit data, the third set of FFs 206 may include eight FFs to receive the second read data RD2.

The clock terminal of each FF of the third set of FFs 206 is coupled with the inverter 116, and configured to receive the second clock signal CLK2, and the control terminal of each FF of the third set of FFs 206 is coupled with the second reset controller 110, and configured to receive the power-on reset signal PS. Thus, the third set of FFs 206 is further configured to receive the second clock signal CLK2 and the power-on reset signal PS.

The output terminal of each FF of the third set of FFs 206 is coupled with the memory controller 102, and configured to output and provide a corresponding read data bit of the first read data RD1 (i.e., a corresponding read data bit of the first set of read data bits) to the memory controller 102. For example, the output terminal of the eighth FF 206a is coupled with the memory controller 102, and configured to output and provide a second read data bit RD1[0] of the first read data RD1 to the memory controller 102. The third set of FFs 206 is thus configured to output and provide the first read data RD1 to the memory controller 102. In an embodiment, the output terminal of each FF of the third set of FFs 206 corresponds to a positive output terminal of each FF of the third set of FFs 206.

When the power-on reset signal PS is deactivated, each FF of the third set of FFs 206 is operational and outputs the associated read data bit of the first read data RD1 at the positive edge of the second clock signal CLK2. Further, each FF of the third set of FFs 206 is non-operational (i.e., is reset) when the power-on reset signal PS is activated. It will be apparent to a person skilled in the art that the first set of read data bits has the same logic states as that of the second set of read data bits, respectively, and is outputted in synchronization with the positive edge of the second clock signal CLK2. In an embodiment, each FF of the third set of FFs 206 is a D FF.

Figure 3B:
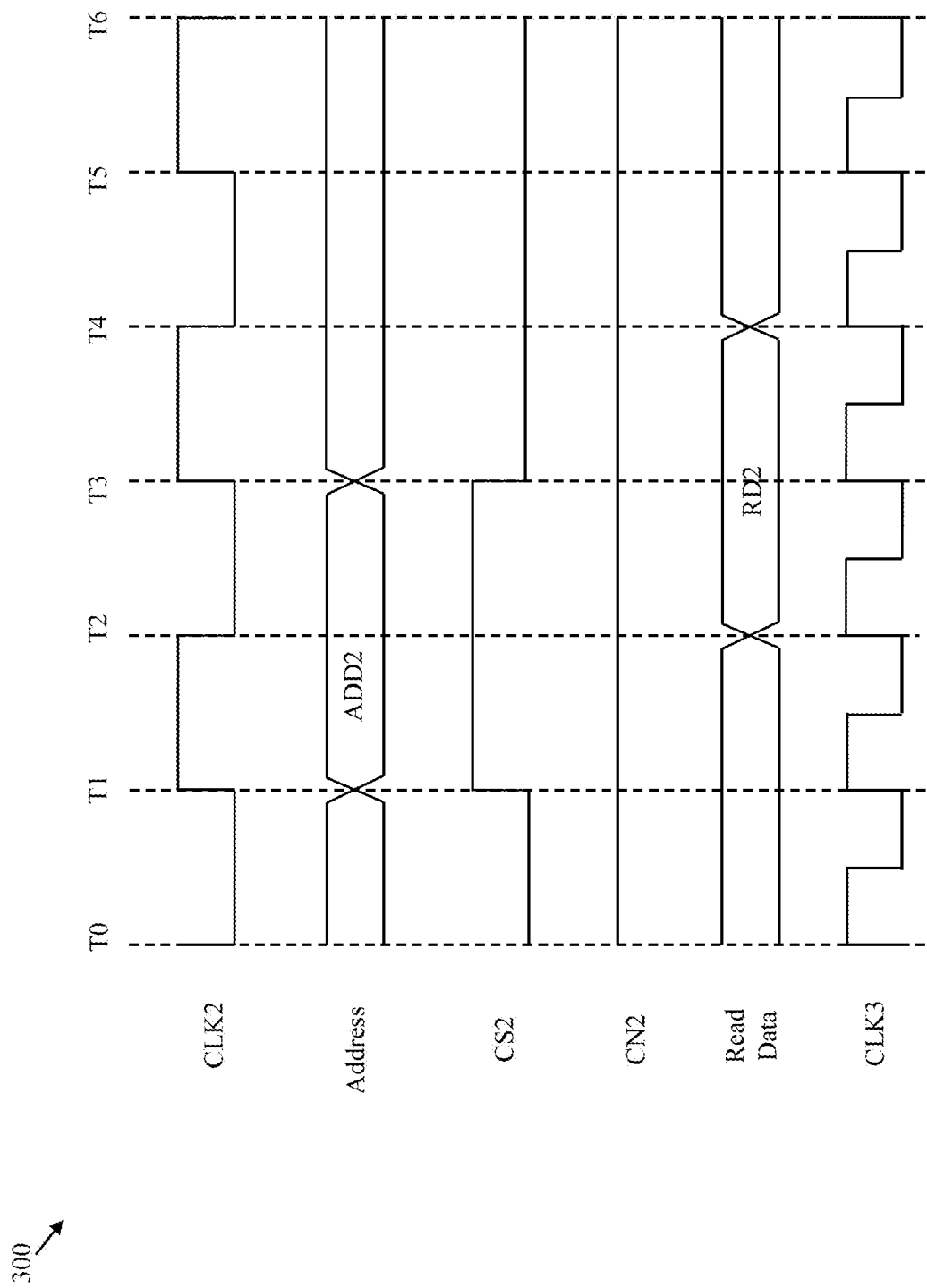

FIGS. 3A and 3B, collectively, represent a timing diagram 300 that illustrates execution of the first read operation with the system memory 106 in accordance with an embodiment of the present disclosure. The first read operation may be initiated by one of the processors of the SoC 100 by providing the transaction request TRQ to the memory controller 102. The transaction request TRQ includes the virtual memory address of the system memory 106 where the data to be read is stored. Upon receiving the transaction request TRQ, the memory controller 102 generates the first address ADD1. Further, the memory controller 102 activates the first chip select signal CS1 to indicate that the memory operation is to be executed with the system memory 106. Similarly, the memory controller 102 activates the first control signal CN1 to indicate that the memory operation is the first read operation.

At time instance T0, the first clock signal CLK1 transitions from a logic low state to a logic high state. The memory controller 102 operates in synchronization with the first clock signal CLK1 (i.e., output corresponding data at the positive edge of the first clock signal CLK1). Thus, the first chip select signal CS1 and the first control signal CN1 are activated (i.e., transition from logic low states to logic high states) at time instance T0. Similarly, the first address ADD1 is provided by the memory controller 102 to the memory management system 104 at time instance T0.

The second clock signal CLK2 is an inverted version of the first clock signal CLK1. Thus, the second clock signal CLK2 transitions from a logic high state to a logic low state at time instance T0. The first set of FFs 202 and the first FF 208 operate in synchronization with the second clock signal CLK2 (i.e., output corresponding data at the positive edge of the second clock signal CLK2). Thus, at time instance T0, the second chip select signal CS2 retains a previous logic state (e.g., a logic low state), and the system memory 106 does not receive any address from the memory management system 104. Further, the second and third FFs 210 and 212 operate in synchronization with the second and first clock signals CLK2 and CLK1, respectively, and the third and fourth control signals CN3 and CN4 are outputted at the subsequent positive edges of the second and first clock signals CLK2 and CLK1, respectively. Thus, at time instance T0, the second control signal CN2 retains a previous logic state (e.g., a logic high state). Further, the third clock signal CLK3 transitions from at a logic low state to a logic high state at time instance T0.

During time period T0-T1, the first clock signal CLK1, the first control signal CN1, and the first chip select signal CS1 remain at logic high states, and the second clock signal CLK2 remains at a logic low state. Further, the second chip select signal CS2 and the second control signal CN2 remain at logic low and logic high states, respectively. The third clock signal CLK3 associated with the system memory 106 has a frequency that is twice the frequencies of the first and second clock signals CLK1 and CLK2. Hence, the third clock signal CLK3 completes one cycle during time period T0-T1.

At time instance T1, the first clock signal CLK1 transitions from a logic high state to a logic low state, and the second clock signal CLK2 transitions from a logic low state to a logic high state. Thus, at time instance T1 (i.e., at the positive edge of the second clock signal CLK2), the first FF 208 outputs the second chip select signal CS2. As the second chip select signal CS2 is outputted based on the first chip select signal CS1 (i.e., as the logic states of the first and second chip select signals CS1 and CS2 are same), the second chip select signal CS2 is activated. Hence, the second chip select signal CS2 transitions from a logic low state to a logic high state at time instance T1. Similarly, the second FF 210 outputs the third control signal CN3 at the positive edge of the second clock signal CLK2 (i.e., at time instance T1). As the third control signal CN3 is outputted based on the first control signal CN1 (i.e., as the logic states of the first and third control signals CN1 and CN3 are same), the third control signal CN3 is activated. As the third control signal CN3 is activated, the second control signal CN2 remains activated. Further, the first set of FFs 202 outputs the second address ADD2 at the positive edge of the second clock signal CLK2 (i.e., at time instance T1), and provides the outputted second address ADD2 to the system memory 106. Additionally, the third clock signal CLK3 transitions from a logic low state to a logic high state at time instance T1. The system memory 106 operates in synchronization with the third clock signal CLK3 (i.e., output corresponding data at a positive edge of the third clock signal CLK3). Thus, at time instance T1, the system memory 106 receives the second address ADD2. As the second control signal CN2 is activated at time instance T1, the first read operation is initiated with the system memory 106 at time instance T1.

During time period T1-T2, the first and second clock signals CLK1 and CLK2 remain at logic low and logic high states, respectively, and the third clock signal CLK3 completes another cycle. The first and second chip select signals CS1 and CS2 and the first and second control signals CN1 and CN2 remain at logic high states during time period T1-T2. Further, during time period T1-T2, the first read operation is executed with the system memory 106.

At time instance T2, the first and third clock signals CLK1 and CLK3 transition from logic low states to logic high states, and the second clock signal CLK2 transitions from a logic high state to a logic low state. Time period T0-T2 thus corresponds to one cycle (i.e., the first cycle) of the first clock signal CLK1. Further, at time instance T2, (i.e., a subsequent positive edge of the third clock signal CLK3), the system memory 106 provides the second read data RD2 to the memory management system 104. Further, the first chip select signal CS1 transitions from a logic high state to a logic low state at time instance T2.

During time period T2-T3, the first and second clock signals CLK1 and CLK2 remain at logic high and logic low states, respectively, and the third clock signal CLK3 completes another cycle. Further, during time period T2-T3, the first chip select signal CS1 remains at a logic low state, and the second chip select signal CS2 and the first and second control signals CN1 and CN2 remain at logic high states.

At time instance T3, the second and third clock signals CLK2 and CLK3 transition from logic low states to logic high states, and the first clock signal CLK1 transitions from a logic high state to a logic low state. Time period T1-T3 thus corresponds to one cycle of the second clock signal CLK2 (i.e., the cycle subsequent to the first cycle). The third set of FFs 206 operates in synchronization with the second clock signal CLK2 (i.e., output corresponding data at the positive edge of the second clock signal CLK2). Thus, at time instance T2, the third set of FFs 206 receives the second read data RD2, and at the subsequent positive edge of the second clock signal CLK2 (i.e., at time instance T3), the third set of FFs 206 outputs the first read data RD1. The memory controller 102 may then generate the transaction response TRS based on the received first read data RD1. The operating frequency of the system memory 106 being twice that of the memory controller 102 and the memory management system 104 ensures that a latency associated with the first read operation is unaffected when the first read operation is executed in a manner as described above. Further, the second chip select signal CS2 transitions from a logic high state to a logic low state at time instance T3.

During time period T3-T6, the first and second chip select signals CS1 and CS2 remain at logic low states. Hence, the memory operation is not executed with the system memory 106. Further, during time period T3-T6, the first and second clock signals CLK1 and CLK2 complete one and a half cycles, whereas the third clock signal CLK3 completes three cycles. Additionally, the first and second control signals CN1 and CN2 remain at logic high states during time period T3-T6. It will be apparent to a person skilled in the art that the transitions of various signals illustrated in FIGS. 3A and 3B are sans set up time associated with each signal to make the illustrations concise and clear and should not be considered as a limitation of the present disclosure.

FIGS. 3A and 3B describe the execution of the first read operation with the system memory 106 when the memory controller 102 is operational (i.e., is not reset). When the memory controller 102 is reset, any one of the first chip select signal CS1, the first control signal CN1, and the first set of address bits of the first address ADD1 may toggle in an asynchronous manner. For example, the memory controller 102 may be reset during time period T0-T1, and as a result, the first chip select signal CS1 and the first control signal CN1 may toggle from logic high states to logic low states. In such a scenario, at time instance T1 (i.e., at the positive edge of the second clock signal CLK2), as the first chip select signal CS1 is deactivated, the first FF 208 deactivates the second chip select signal CS2. As a result, the memory operation is not executed with the system memory 106. Hence, the system memory 106 is unaffected by the asynchronous toggling of the first chip select signal CS1 and the first control signal CN1 during time period T0-T1. In other words, the system memory 106 is retained during the asynchronous reset of the memory controller 102.

The memory controller 102 may similarly be reset during time period T1-T2, and as a result, the first chip select signal CS1, the first control signal CN1, and the first address ADD1 may toggle in an asynchronous manner. For example, the first chip select signal CS1 and the first control signal CN1 may toggle from logic high states to logic low states, and a value of the first address ADD1 may change. However, the second chip select signal CS2 and the second control signal CN2 are at logic high states at time instance T1. Hence, the first read operation is initiated with the system memory 106 at time instance TL. Thus, the asynchronous toggling of the first chip select signal CS1 and the first control signal CN1 during time period T1-T2 does not change the memory operation that is to be executed with the system memory 106. The asynchronous toggling of the first address ADD1 may result in reading of data stored at a memory address that is different that a desired memory address (i.e., the first address ADD1). The execution of such a read operation however does not lead to memory corruption of the system memory 106. Thus, the system memory 106 is unaffected by the asynchronous toggling of the first chip select signal CS1, the first control signal CN1, and the first address ADD1 during time period T1-T2. In other words, the system memory 106 is retained during the asynchronous reset of the memory controller 102.

The memory controller 102 may further be reset during time period T2-T3. As a result, the first chip select signal CS1, the first control signal CN1, and the first address ADD1 may toggle in an asynchronous manner. For example, the first chip select signal CS1 and the first control signal CN1 may toggle from logic high states to logic low states, and a value of the first address ADD1 may change. However, as the second chip select signal CS2 remains activated during time period T1-T3, the memory operation (i.e., the first read operation) is successfully executed with the system memory 106, and the system memory 106 is unaffected by the asynchronous toggling of the first chip select signal CS1, the first control signal CN1, and the first address ADD1 during time period T2-T3. In other words, the system memory 106 is retained during the asynchronous reset of the memory controller 102.

Figure 4A:
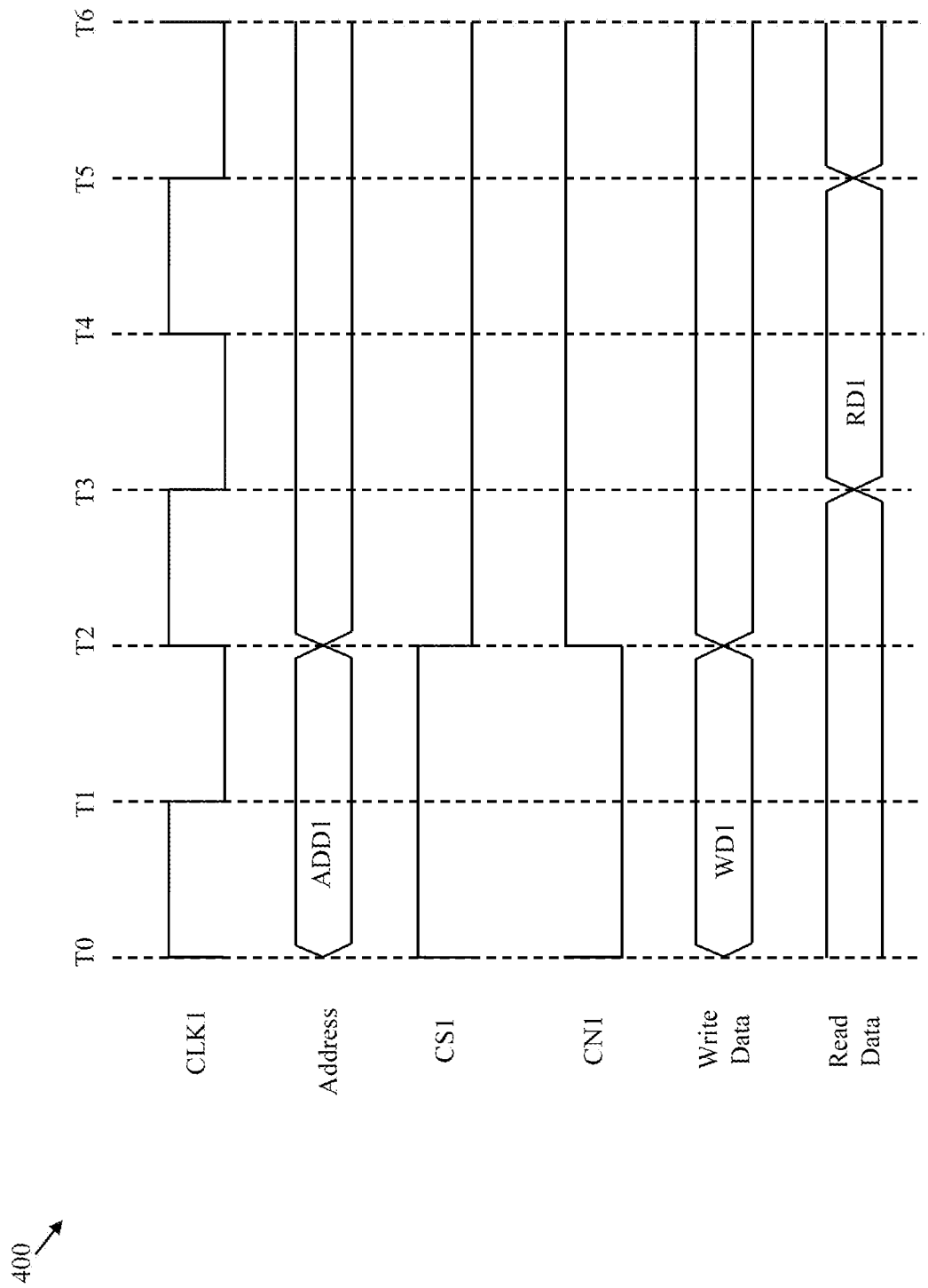
FIGS. 4A and 4B, collectively, represent a timing diagram that illustrates execution of a first write operation with the system memory in accordance with an embodiment of the present disclosure.
Figure 4B:
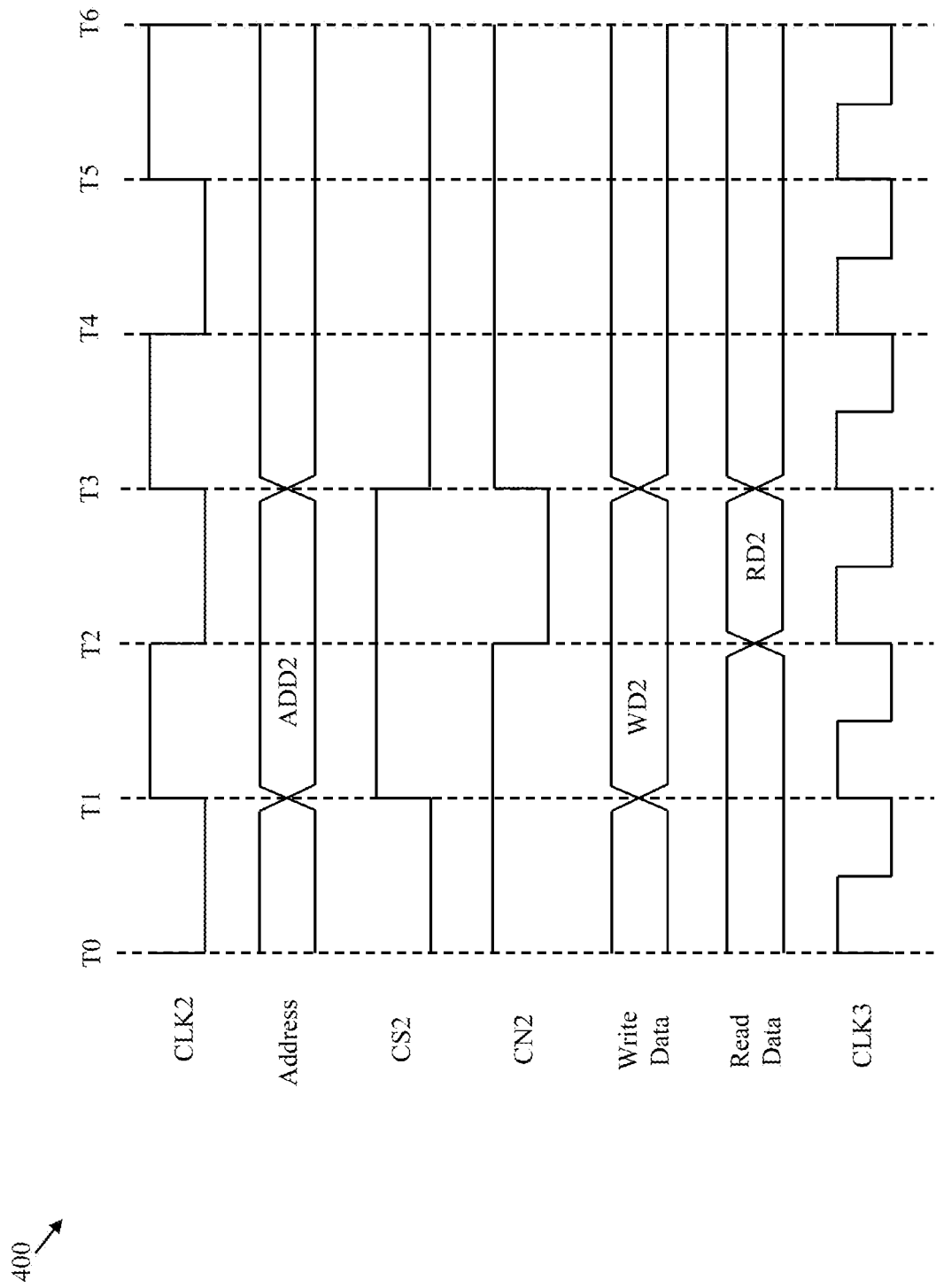

FIGS. 4A and 4B, collectively, represent a timing diagram 400 that illustrates the execution of the first write operation with the system memory 106 in accordance with an embodiment of the present disclosure. The first write operation may be initiated by one of the processors of the SoC 100 by providing the transaction request TRQ to the memory controller 102. In such a scenario, the transaction request TRQ includes the first write data WD1 and the virtual memory address of the system memory 106 where the first write data WD1 is to be written. Based on the received transaction request TRQ, the memory controller 102 generates the first address ADD1. Further, the memory controller 102 activates the first chip select signal CS1 to indicate that the memory operation is to be executed with the system memory 106, and deactivates the first control signal CN1 to indicate that the memory operation is the first write operation.

At time instance T0, the first clock signal CLK1 transitions from a logic low state to a logic high state. The memory controller 102 operates in synchronization with the first clock signal CLK1. Hence, the first chip select signal CS1 and the first control signal CN1 are activated and deactivated at time instance T0. Further, the first address ADD1 is provided by the memory controller 102 to the memory management system 104 at time instance T0. Additionally, as the memory operation corresponds to the first write operation, the memory controller 102 further outputs and provides the first write data WD1 to the memory management system 104 at time instance T0.

The second clock signal CLK2 is an inverted version of the first clock signal CLK1. Thus, the second clock signal CLK2 transitions from a logic high state to a logic low state at time instance T0. Further, the first and second sets of FFs 202 and 204, and the first FF 208 operate in synchronization with the second clock signal CLK2. Thus, at time instance T0, the second chip select signal CS2 retains a previous logic state (e.g., a logic low state), and the system memory 106 does not receive any address and/or write data from the memory management system 104. Further, the second and third FFs 210 and 212 operate in synchronization with the second and first clock signals CLK2 and CLK1, respectively, and the third and fourth control signals CN3 and CN4 are outputted at the subsequent positive edges of the second and first clock signals CLK2 and CLK1, respectively. Thus, at time instance T0, the second control signal CN2 retains a previous logic state (e.g., a logic high state). Further, the third clock signal CLK3 transitions from at a logic low state to a logic high state at time instance T0.

During time period T0-T1, the first clock signal CLK1, the first chip select signal CS1, and the second control signal CN2 remain at logic high states, and the first control signal CN1, the second clock signal CLK2, and the second chip select signal CS2 remain at logic low states. The third clock signal CLK3 associated with the system memory 106 has a frequency that is twice the frequencies of the first and second clock signals CLK1 and CLK2. Hence, the third clock signal CLK3 completes one cycle during time period T0-T1.

At time instance T1, the first clock signal CLK1 transitions from a logic high state to a logic low state, and the second clock signal CLK2 transitions from a logic low state to a logic high state. Thus, at time instance T1 (i.e., at the positive edge of the second clock signal CLK2), the first FF 208 outputs the second chip select signal CS2. As the second chip select signal CS2 is outputted based on the first chip select signal CS1 (i.e., as the logic states of the first and second chip select signals CS1 and CS2 are same), the second chip select signal CS2 is activated. Hence, the second chip select signal CS2 transitions from a logic low state to a logic high state at time instance T1. Similarly, the first and second sets of FFs 202 and 204 output the second address ADD2 and the second write data WD2 at the positive edge of the second clock signal CLK2 (i.e., at time instance T1), and provide the outputted second address ADD2 and the outputted second write data WD2 to the system memory 106, respectively.

The second FF 210 operates in synchronization with the second clock signal CLK2, and outputs the third control signal CN3 at the positive edge of the second clock signal CLK2 (i.e., at time instance T1). As the third control signal CN3 is outputted based on the first control signal CN1 (i.e., as the logic states of the first and third control signals CN1 and CN3 are same), the third control signal CN3 is deactivated. However, the third FF 212 operates in synchronization with the first clock signal CLK1, and hence retains a previous logic state (e.g., a logic high state) at time instance T1. As the third and fourth control signals CN3 and CN4 are at logic low and logic high states, respectively, the second control signal CN2 remains at a logic high state at time instance T1.

The third clock signal CLK3 transitions from a logic low state to a logic high state at time instance T1. The system memory 106 operates in synchronization with the third clock signal CLK3 (i.e., output corresponding data at the positive edge of the third clock signal CLK3). Thus, at time instance T1, the system memory 106 receives the second address ADD2 and the second write data WD2. As the second control signal CN2 is activated at time instance T1, the second read operation is initiated with the system memory 106 at time instance T1.

During time period T1-T2, the first and second clock signals CLK1 and CLK2 remain at logic low and logic high states, respectively, and the third clock signal CLK3 completes another cycle. Further, during time period T1-T2, the first and second chip select signals CS1 and CS2 and the second control signal CN2 remain at logic high states, and the first control signal CN1 remains at a logic low state. Further, the second read operation is executed with the system memory 106 during time period T1-T2.

At time instance T2, the first and third clock signals CLK1 and CLK3 transition from logic low states to logic high states, and the second clock signal CLK2 transitions from a logic high state to a logic low state. Time period T0-T2 thus corresponds to one cycle (i.e., the first cycle) of the first clock signal CLK1. Further, at time instance T2, (i.e., at the subsequent positive edge of the third clock signal CLK3), the second read data RD2 stored at the second address ADD2 is outputted by the system memory 106. The third set of FFs 206 may then receive the outputted second read data RD2 at time instance T2, and output and provide the first read data RD1 to the memory controller 102 at time instance T3. In such a scenario, as the memory operation corresponds to the first write operation, the memory controller 102 may discard the received first read data RD1.

At time instance T2, as the first clock signal CLK1 transitions from a logic low state to a logic high state, the third FF 212 outputs the fourth control signal CN4. As the fourth control signal CN4 is outputted based on the first control signal CN1 (i.e., as the logic states of the first and fourth control signals CN1 and CN4 are same), the fourth control signal CN4 is deactivated. As a result, the second control signal CN2 transitions from a logic high state to a logic low state at time instance T2. Consequently, the first write operation is initiated with the system memory 106 at time instance T2. Further, at time instance T2, the first chip select signal CS1 transitions from a logic high state to a logic low state, and the first control signal CN1 transitions from a logic low state to a logic high state.

During time period T2-T3, the first and second clock signals CLK1 and CLK2 remain at logic high and logic low states, respectively, and the third clock signal CLK3 completes another cycle. Further, during time period T2-T3, the first chip select signal CS1 and the second control signal CN2 remain at logic low states, and the second chip select signal CS2 and the first control signal CN1 remain at logic high states.

At time instance T3, the second and third clock signals CLK2 and CLK3 transition from logic low states to logic high states, and the first clock signal CLK1 transitions from a logic high state to a logic low state. Time period T1-T3 thus corresponds to one cycle of the second clock signal CLK2 (i.e., the cycle subsequent to the first cycle). Further, at the subsequent positive edge of the third clock signal CLK3 (i.e., at time instance T3), the second write data WD2 is written at the second address ADD2. In such a scenario, the memory controller 102 may generate the transaction response TRS indicative of the successful execution of the memory operation. Further, at time instance T3, the second chip select signal CS2 transitions from a logic high state to a logic low state, and the second control signal CN2 transitions from a logic low state to a logic high state.

The execution of the second read operation with the system memory 106 followed by the first write operation when the memory operation corresponds to the first write operation prevents memory corruption of the system memory 106. Further, the operating frequency of the system memory 106 being twice that of the memory controller 102 and the memory management system 104 ensures that a latency associated with the first write operation is unaffected when the first write operation is executed in a manner as described above.

During time period T3-T6, the first and second chip select signals CS1 and CS2 remain at logic low states. Hence, the memory operation is not executed with the system memory 106. Further, during time period T3-T6, the first and second clock signals CLK1 and CLK2 complete one and a half cycles, whereas the third clock signal CLK3 completes three cycles. Additionally, the first and second control signals CN1 and CN2 remain at logic high states during time period T3-T6. It will be apparent to a person skilled in the art that the transitions of various signals illustrated in FIGS. 4A and 4B are sans set up time associated with each signal to make the illustrations concise and clear and should not be considered as a limitation of the present disclosure.

FIGS. 4A and 4B describe the execution of the first write operation with the system memory 106 when the memory controller 102 is operational (i.e., is not reset). When the memory controller 102 is reset, any one of the first chip select signal CS1, the first control signal CN1, the first set of address bits of the first address ADD1, and the first set of write data bits of the first write data WD1 may toggle in an asynchronous manner. For example, the memory controller 102 may be reset during time period T0-T1, and as a result, the first chip select signal CS1 and the first control signal CN1 may transition from logic high and logic low states to logic low and logic high states, respectively. Thus, at time instance T1 (i.e., at the positive edge of the second clock signal CLK2), the first chip select signal CS1 is at a logic low state. Hence, the first FF 208 deactivates the second chip select signal CS2. As a result, the memory operation is not executed with the system memory 106. Thus, the system memory 106 is unaffected by the asynchronous toggling of the first chip select signal CS1 and the first control signal CN1 during time period T0-T1. In other words, the system memory 106 is retained during the asynchronous reset of the memory controller 102.

The memory controller 102 may further be reset during time period T1-T2. As a result, the first chip select signal CS1, the first control signal CN1, the first address ADD1, and the first write data WD1 may toggle in an asynchronous manner. For example, the first chip select signal CS1 and the first control signal CN1 may toggle from logic high and logic low states to logic low and high states, respectively. Similarly, values of the first address ADD1 and the first write data WD1 may change. However, as the second chip select signal CS2 and the second control signal CN2 are activated at time instance T1, the first read operation is initiated with the system memory 106 at time instance T1, and executed during time period T1-T2. Further, the asynchronous toggling of the first control signal CN1 during time period T1-T2 may result in activation of the fourth control signal CN4 at time instance T2. Thus, at time instance T2, the second control signal CN2 may remain at a logic high state instead of transitioning to a logic low state. As a result, during time period T2-T3, another read operation (e.g., a third read operation) may be executed with the system memory 106 instead of the first write operation. However, the execution of such a read operation does not lead to memory corruption of the system memory 106. Thus, the system memory 106 is unaffected by the asynchronous toggling of the first chip select signal CS1, the first control signal CN1, the first address ADD1, and the first write data WD1 during time period T1-T2. In other words, the system memory 106 is retained during the asynchronous reset of the memory controller 102.

The memory controller 102 may further be reset during time period T2-T3. As a result, the first chip select signal CS1, the first control signal CN1, the first address ADD1, and the first write data WD1 may toggle in an asynchronous manner. For example, the first chip select signal CS1 and the first control signal CN1 may toggle from logic low and logic high states to logic high and logic low states, respectively, and values of the first address ADD1 and the first write data WD1 may change. However, as the accurate chip select signal (i.e., the second chip select signal CS2), the accurate control signal (i.e., the second control signal CN2), the accurate address (i.e., the second address ADD2), and the accurate write data (i.e., the second write data WD2) are provided to the system memory 106 before or at time instance T2, the memory operation (i.e., the first write operation) is successfully executed with the system memory 106. Thus, the system memory 106 is unaffected by the asynchronous toggling of the first chip select signal CS1, the first control signal CN1, the first address ADD1, and the first write data WD1 during time period T2-T3. In other words, the system memory 106 is retained during the asynchronous reset of the memory controller 102.

Thus, the utilization of the memory management system 104 of the present disclosure in the SoC 100 for controlling memory operations associated with the system memory 106 ensures that the reset of the memory controller 102 during either of read or write operation does not lead to memory corruption of the system memory 106. Further, the memory management system 104 is reset based on the power-on reset signal PS, and hence is unaffected by the reset of the memory controller 102 (i.e., detection of the asynchronous reset event in the SoC 100). Thus, when the asynchronous reset signal ARS is generated in an activated state, a need to delay the provision of the activated asynchronous reset signal ARS to the memory controller 102 and other functional components of the SoC 100 is eliminated. In other words, when the asynchronous reset signal ARS is generated in an activated state, the activated asynchronous reset signal ARS is provided to the memory controller 102 and other functional components of the SoC 100 instantaneously. Hence, a reaction time associated with the detected asynchronous reset event in the SoC 100 is significantly less than that in an SoC implementing a conventional memory retention technique. The conventional memory retention technique includes delaying the reset of a memory controller and other functional components of the SoC until a corresponding system memory has transitioned to a default state. Further, as the reset of the memory controller 102 and other functional components of the SoC 100 is not delayed, none of the functional components operate in a faulty condition. Thus, reliability and accuracy of the SoC 100 of the present disclosure are significantly greater than that of an SoC implementing the conventional memory retention technique.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. A memory management system coupled between a memory controller and a system memory for controlling a memory operation associated with the system memory, the memory management system comprising:
  a first flip-flop (FF) that is coupled with the memory controller, and configured to receive a first control signal indicative of the memory operation, a power-on reset signal, and a first clock signal, and output a second control signal;
  a second FF that is coupled with the memory controller, and configured to receive the first control signal, the power-on reset signal, and a second clock signal, and output a third control signal; and
  a logic gate that is coupled with the first and second FFs and the system memory, and configured to receive the second and third control signals, and output and provide a fourth control signal to the system memory to control an execution of the memory operation, wherein the fourth control signal is outputted such that when the memory operation corresponds to a first read operation, the first read operation is executed with the system memory, and when the memory operation corresponds to a first write operation, a second read operation is executed with the system memory followed by the first write operation.

2. The memory management system of claim 1, wherein the first and second clock signals are complementary signals.

3. The memory management system of claim 1, further comprising:
  a first set of FFs that is coupled between the memory controller and the system memory, and configured to receive a first address associated with the memory operation, the power-on reset signal, and the second clock signal, and output and provide a second address associated with the memory operation to the system memory to facilitate the execution of the memory operation; and
  a third FF that is coupled between the memory controller and the system memory, and configured to receive a first chip select signal associated with the memory operation, the power-on reset signal, and the second clock signal, and output and provide a second chip select signal associated with the memory operation to the system memory to control the execution of the memory operation.

4. The memory management system of claim 3, further comprising a second set of FFs that is coupled between the memory controller and the system memory, wherein when the memory operation corresponds to the first write operation, the second set of FFs is configured to receive first write data associated with the memory operation, the power-on reset signal, and the second clock signal, and output and provide second write data associated with the memory operation to the system memory to facilitate the execution of the memory operation.

5. The memory management system of claim 3, further comprising a third set of FFs that is coupled between the memory controller and the system memory, wherein based on the execution of the memory operation, the third set of FFs is configured to receive first read data associated with the memory operation, the power-on reset signal, and the second clock signal, and output and provide second read data associated with the memory operation to the memory controller.

6. The memory management system of claim 1, wherein a frequency of each of the first and second clock signals is half of a frequency of a third clock signal that is associated with the system memory.

7. The memory management system of claim 1, wherein the first control signal is activated and deactivated when the memory operation corresponds to the first read and first write operations, respectively, and wherein when the fourth control signal is activated, at least one of the first and second read operations are executed with the system memory, and when the fourth control signal is deactivated, the first write operation is executed with the system memory.

8. The memory management system of claim 7, wherein when the first control signal is activated for a first cycle of the first clock signal, the fourth control signal is activated for a subsequent cycle of the second clock signal, and wherein when the first control signal is deactivated for the first cycle of the first clock signal, the fourth control signal is activated for a first half of the subsequent cycle of the second clock signal, and deactivated for a second half of the subsequent cycle of the second clock signal.

9. The memory management system of claim 1, wherein when the memory operation corresponds to the first write operation, the execution of the second read operation with the system memory followed by the first write operation prevents memory corruption of the system memory.

10. A system-on-chip (SoC), comprising:
a system memory;
a memory controller; and
a memory management system that is coupled between the memory controller and the system memory, and configured to control a memory operation associated with the system memory, the memory management system comprising:
a first flip-flop (FF) that is coupled with the memory controller, and configured to receive a first control signal indicative of the memory operation, a power-on reset signal, and a first clock signal, and output a second control signal;
a second FF that is coupled with the memory controller, and configured to receive the first control signal, the power-on reset signal, and a second clock signal, and output a third control signal; and a logic gate that is coupled with the first and second FFs and the system memory, and configured to receive the second and third control signals, and output and provide a fourth control signal to the system memory to control an execution of the memory operation, wherein the fourth control signal is outputted such that when the memory operation corresponds to a first read operation, the first read operation is executed with the system memory, and when the memory operation corresponds to a first write operation, a second read operation is executed with the system memory followed by the first write operation.

11. The SoC of claim 10, wherein the first and second clock signals are complementary signals.

12. The SoC of claim 10, wherein the memory management system further includes:
a first set of FFs that is coupled between the memory controller and the system memory, and configured to receive a first address associated with the memory operation, the power-on reset signal, and the second clock signal, and output and provide a second address associated with the memory operation to the system memory to facilitate the execution of the memory operation; and
a third FF that is coupled between the memory controller and the system memory, and configured to receive a first chip select signal associated with the memory operation, the power-on reset signal, and the second clock signal, and output and provide a second chip select signal associated with the memory operation to the system memory to control the execution of the memory operation.

13. The SoC of claim 12, wherein the memory controller is configured to generate and provide, to facilitate the execution of the memory operation, the first control signal to the first and second FFs, the first address to the first set of FFs, and the first chip select signal to the third FF.

14. The SoC of claim 12, wherein the memory management system further includes a second set of FFs that is coupled between the memory controller and the system memory, and wherein when the memory operation corresponds to the first write operation, the second set of FFs is configured to receive first write data associated with the memory operation, the power-on reset signal, and the second clock signal, and output and provide second write data associated with the memory operation to the system memory to facilitate the execution of the memory operation.

15. The SoC of claim 12, wherein the memory management system further includes a third set of FFs that is coupled between the memory controller and the system memory, and wherein based on the execution of the memory operation, the third set of FFs is configured to receive first read data associated with the memory operation, the power-on reset signal, and the second clock signal, and output and provide second read data associated with the memory operation to the memory controller.

16. The SoC of claim 10, wherein the first control signal is activated and deactivated when the memory operation corresponds to the first read and first write operations, respectively, and wherein when the fourth control signal is activated, at least one of the first and second read operations are executed with the system memory, and when the fourth control signal is deactivated, the first write operation is executed with the system memory.

17. The SoC of claim 16, wherein when the first control signal is activated for a first cycle of the first clock signal, the fourth control signal is activated for a subsequent cycle of the second clock signal, and wherein when the first control signal is deactivated for the first cycle of the first clock signal, the fourth control signal is activated for a first half of the subsequent cycle of the second clock signal, and deactivated for a second half of the subsequent cycle of the second clock signal.

18. The SoC of claim 10, further comprising:
a first reset controller that is coupled with the memory controller, and configured to generate and provide an asynchronous reset signal to the memory controller to reset the memory controller; and
a second reset controller that is coupled with the memory management system, and configured to generate and provide the power-on reset signal to the memory management system to reset the memory management system.

19. The SoC of claim 10, further comprising:
a first clock circuit that is coupled with the memory controller and the memory management system, and configured to generate and provide the first clock signal to the memory controller and the memory management system;
an inverter that is coupled with the first clock circuit and the memory management system, and configured to receive the first clock signal, and generate and provide the second clock signal to the memory management system; and
a second clock circuit that is coupled with the system memory, and configured to generate and provide a third clock signal to the system memory, wherein a frequency of each of the first and second clock signals is half of a frequency of the third clock signal.

20. The SoC of claim 10, wherein when the memory operation corresponds to the first write operation, the execution of the second read operation with the system memory followed by the first write operation prevents memory corruption of the system memory.

* * * * *